(12) United States Patent
Hill

(10) Patent No.: US 6,700,665 B2
(45) Date of Patent: Mar. 2, 2004

(54) INTERFEROMETRIC APPARATUS FOR MEASURING THE TOPOGRAPHY OF MIRRORS IN SITU AND PROVIDING ERROR CORRECTION SIGNALS THEREFOR

(75) Inventor: Henry Allen Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 0 days.

(21) Appl. No.: 10/217,531

(22) Filed: Aug. 13, 2002

(65) Prior Publication Data

US 2003/0035114 A1 Feb. 20, 2003

Related U.S. Application Data (60) Provisional application No. 60/313,645, filed on Aug. 20, 2001.

(51) Int. Cl.[7] .................................................. G01B 9/02
(52) U.S. Cl. ....................................................... 356/500
(58) Field of Search ................................ 356/486, 487, 356/493, 498, 500

(56) References Cited

U.S. PATENT DOCUMENTS

| | | | |
|---|---|---|---|
| 5,114,234 A | * | 5/1992 | Otsuka et al. .............. 356/500 |
| 5,151,749 A | | 9/1992 | Tanimoto et al. ........... 356/500 |
| 5,187,543 A | | 2/1993 | Ebert |
| 5,363,196 A | | 11/1994 | Cameron ..................... 356/500 |
| 5,764,361 A | | 6/1998 | Kato et al. |
| 5,790,253 A | | 8/1998 | Kamiya |
| 6,020,964 A | * | 2/2000 | Loopstra et al. ............ 356/500 |
| 6,134,007 A | | 10/2000 | Naraki et al. |
| 2003/0090675 A1 | | 5/2003 | Fujiwara |

FOREIGN PATENT DOCUMENTS

JP   10260009 A   *   9/1998

* cited by examiner

*Primary Examiner*—Samuel A. Turner
(74) *Attorney, Agent, or Firm*—Francis J. Caufield (57) ABSTRACT

Interferometric apparatus and methods by which the local surface characteristics of photolithographic mirrors or the like may be interferometrically measured in-situ to provide correction signals for enhanced distance and angular measurement accuracy. Surface characterizations along one or multiple datum lines in one or more directions may be made by measuring the angular changes in beams reflected off the surfaces during scanning operations to determine local slope and then integrating the slope to arrive at surface topology. The mirrors may be mounted either on the photolithographic stages or off the photolithographic stages on a reference frame.

19 Claims, 6 Drawing Sheets

INTERFEROMETRIC APPARATUS FOR MEASURING THE TOPOGRAPHY OF MIRRORS IN SITU AND PROVIDING ERROR CORRECTION SIGNALS THEREFOR

CROSS REFERENCE TO RELATED APPLICATION

This application is related to U.S. patent application Ser. No. 09/853,114 entitled "IN-SITU MIRROR CHARACTERIZATION" and filed on May 10, 2001 in the name of Henry Allen Hill, the entire contents of which is incorporated herein by reference, and claims priority from U.S. Provisional Patent Application No. 60/313,645 filed on Aug. 20, 2001 in the name of Henry Allen Hill and bearing the title "IN-SITU MIRROR CHARACTERIZATION", the entire contents of which is also incorporated herein by reference.

BACKGROUND OF THE INVENTION

This invention in general relates to interferometry and in particular to interferometric apparatus and methods by which the local surface characteristics of photolithographic stage mirrors or the like may be interferometrically measured in-situ to provide correction signals for enhanced distance measurement accuracy.

Interferometry is a well established metrology used extensively in microfabrication processes to measure and control a host of critical dimensions. It is especially important in manufacturing semiconductors and the like where requirements for precision are 10 to 40% better than critical dimensions of 0.1 $\mu$m or less.

Integrated circuits made of semiconductor materials are constructed by successively depositing and patterning layers of different materials on a silicon wafer while it typically resides in a flat exposure plane having Cartesian x-y coordinates to which there is a normal z-direction. The patterning process consists of a combination of exposure and development of photoresist followed by etching and doping of the underlying layers followed by the deposition of subsequent layers. This process results in a complex and, on the scale of microns, very nonhomogeneous material structure on the wafer surface.

Typically each wafer contains multiple copies of the same pattern called "fields" arrayed on the wafer in a nominally rectilinear distribution known as the "grid." Often, but not always, each field corresponds to a single "chip."

The exposure process consists of projecting the image of the next layer pattern onto (and into) the photoresist that has been spun onto the wafer. For an integrated circuit to function properly each successive projected image must be accurately matched to the patterns already on the wafer. The process of determining the position, orientation, and distortion of the patterns already on the wafer, and then placing them in the correct relation to the projected image, is termed "alignment." The actual outcome, i.e., how accurately each successive patterned layer is matched to the previous layers, is termed "overlay."

In general, the alignment process requires both translational and rotational positioning of the wafer and/or the projected image as well as some distortion of the image to match the actual shape of the patterns already present. The fact that the wafer and the image need to be positioned correctly to get one pattern on top of the other is obvious. Actual distortion of the image is often needed as well. Other effects, such as thermal and vibration, may require compensation as well.

The net consequence of all this is that the shape of the first-level pattern printed on the wafer is not ideal and all subsequent patterns must, to the extent possible, be adjusted to fit the overall shape of the first-level printed pattern. Different exposure tools have different capabilities to account for these effects, but, in general, the distortions or shape variations that can be accounted for include x and y magnification and skew. These distortions, when combined with translation and rotation, make up the complete set of linear transformations in the plane.

Since the problem is to successively match the projected image to the patterns already on the wafer, and not simply to position the wafer itself, the exposure tool must effectively be able to detect or infer the relative position, orientation, and distortion of both the wafer patterns themselves and the projected image.

It is difficult to directly sense circuit patterns themselves, and therefore, alignment is accomplished by adding fiducial marks or "alignment marks" to the circuit patterns. These alignment marks can be used to determine the reticle position, orientation, and distortion and/or the projected image position, orientation, and distortion. They can also be printed on the wafer along with the circuit pattern and hence can be used to determine the wafer pattern position, orientation, and distortion. Alignment marks generally consist of one or more clear or opaque lines on the reticle, which then become "trenches" or "mesas" when printed on the wafer. But more complex structures such as gratings, which are simply periodic arrays of trenches and/or mesas, and checkerboard patterns are also used. Alignment marks are usually located either along the edges of "kerf" of each field or a few "master marks" are distributed across the wafer. Although alignment marks are necessary, they are not part of the chip circuitry and therefore, from the chip maker's point of view, they waste valuable wafer area or "real estate." This drives alignment marks to be as small as possible, and they are often less than a few hundred micrometers on a side.

Alignment sensors are incorporated into the exposure tool to "see" alignment marks. Generally there are separate sensors for the wafer, the reticle, and/or the projected image itself. Depending on the overall alignment strategy, these sensors may be entirety separate systems or they may be effectively combined into a single sensor. For example, a sensor that can see the projected image directly would nominally be "blind" with respect to wafer marks and hence a separate wafer sensor is required. But a sensor that "looks" at the wafer through the reticle alignment marks themselves is essentially performing reticle and wafer alignment simultaneously and hence no separate reticle sensor is necessary. Note that in this case the positions of the alignment marks in the projected image are being inferred from the positions of the reticle alignment marks and a careful calibration of reticle to image positions must have been performed before the alignment step.

Furthermore, as implied above, essentially all exposure tools use sensors that detect the wafer alignment marks optically. That is, the sensors project light at one or more wavelengths onto the wafer and detect the scattering/diffraction from the alignment marks as a function of position in the wafer plane. Many types of alignment sensors are in common use and their optical configurations cover the full spectrum from simple microscopes to heterodyne grating interferometers. Also, since different sensor configurations operate better or worse on given wafer types, most exposure tools carry more than one sensor configuration to allow for good overlay on the widest possible range of wafer types.

The overall job of an alignment sensor is to determine the position of each of a given subset of all the alignment marks on a wafer in a coordinate system fixed with respect to the exposure tool. These position data are then used in either of two generic ways termed "global" and "field-by-field" to perform alignment. In global alignment the marks in only a few fields are located by the alignment sensor(s) and the data are combined in a best-fit sense to determine the optimum alignment of all the fields on the wafer. In field-by-field alignment the data collected from a single field are used to align only that field. Global alignment is usually both faster, because not all the fields on the wafer are located, and less sensitive to noise, because it combines all the data together to find a best overall fit. But, since the results of the best fit are used in a feed-forward or dead reckoning approach, it does rely on the overall optomechanical stability of the exposure tool.

Alignment is generally implemented as a two-step process; that is, a fine alignment step with an accuracy of tens of nanometers follows an initial coarse alignment step with an accuracy of micrometers, and alignment requires positioning the wafer in all six degrees of freedom: three translation and three rotation. But adjusting the wafer so that it lies in the projected image plane, i.e., leveling and focusing the wafer, which involves one translational degree of freedom (motion along the optic axis, the z-axis or a parallel normal to the x-y wafer orientation) and two rotational degrees of freedom (orienting the plane of the wafer to be parallel to the projected image plane), is generally considered separate from alignment. Only in-plane translation (two degrees of freedom) and rotation about the projection optic axis (one degree of freedom) are commonly meant when referring to alignment. The reason for this separation in nomenclature is the difference in accuracy required. The accuracy required for in-plane translation and rotation generally needs to be on the order of several tens of nanometers or about 20 to 30% of the minimum feature size or critical dimension (CD) to be printed on the wafer. Current state-of-the-art CD values are on the order of several hundred nanometers, and thus, the required alignment accuracy is less than 100 nm. On the other hand, the accuracy required for out-of-plane translation and rotation is related to the total usable depth of focus of the exposure tool, which is generally close to the CD value. Thus, out-of-plane focusing and leveling the wafer require less accuracy than in-plane alignment. Also, the sensors for focusing and leveling are usually completely separate from the "alignment sensors" and focusing and leveling do not usually rely on patterns on the wafer. Only the wafer surface or its surrogate needs to be sensed. Nevertheless, this is still a substantial task requiring, among other things, precise knowledge about the vertical position (the altitude) of the optical projection system above the wafer.

To achieve alignment, it is known to use dynamic interferometers in which distance measurements are enhanced through the use of dynamic elements whose angular orientation is controlled via feedback arrangements to assure that beams carrying distance information are properly aligned to provide optimal signal. Such interferometers are shown, for example, in International Application No. PCT/US00/12097 filed May 5, 2000, and entitled "Interferometry Systems Having a Dynamic Beam-Steering Assembly For Measuring Angle and Distance" by Henry A. Hill, the contents of which were published as WO 00/66969 on Nov. 9, 2000 and in U.S. Pat. No. 6,271,923 issued on Aug. 7, 2001. It is also known to use passive zero shear interferometers such as those described in U.S. Provisional Patent Application No. 60/309,608 filed on Aug. 2, 2001 in the name of Henry A. Hill with the title "PASSIVE ZERO SHEAR INTERFEROMETER", now incorporated in U.S. patent application No. 10/207,314 filed Jul. 29, 2002. However, even with dynamic and passive zero shear interferometers, the shape of various reflecting elements impacts on the achievable accuracy in distance measurements and impacts on the achievable accuracy in angle measurements, because for the latter local slope changes influence beam directions, as stage mirrors undergo their various motions. Typically, the shape of such reflecting elements, such as thin high aspect ratio mirrors, is characterized off-stage and, if judged to be of adequate consistency, are then mounted on-stage. However, this is often unacceptable because the mounting process itself distorts the shape of the element compared with its inspected shape, and this change in shape can introduce measurement errors.

Accordingly, it is a major object of the present invention to provide interferometric apparatus and methods by which the shapes of on-stage reflecting elements, such as thin high aspect ratio mirrors, may be measured in-situ, after mounting, to develop correction signals that compensate for errors in optical path lengths and in beam directions related to shapes of reflecting surfaces.

It is another object of the present invention to provide interferometric apparatus and methods by which the shapes of on-stage reflecting elements, such as thin high aspect ratio mirrors, may be measured in-situ, after mounting, to develop correction signals that compensate for errors in optical path lengths and in beam directions related to shapes of reflecting surfaces arranged in orthogonal planes.

It is yet another object of the present invention to exploit information generated from the operating properties of dynamic interferometers by which the shapes of on-stage reflecting elements, such as thin high aspect ratio mirrors, may be measured in-situ, after mounting, to develop correction signals that compensate for errors in optical path lengths and in beam directions related to shapes of reflecting surfaces.

It is yet another object of the present invention to provide interferometric apparatus and methods by which the shapes of off-stage reflecting elements, such as thin high aspect ratio mirrors, may be measured in-situ, after mounting, to develop correction signals that compensate for errors in optical path lengths and in beam directions related to shapes of reflecting surfaces.

It is still another object of the present invention to provide interferometric apparatus and methods by which the shapes of off-stage reflecting elements, such as thin high aspect ratio mirrors, may be measured in-situ in dynamic and/or passive zero shear interferometers, after mounting, to develop correction signals that compensate for errors in optical path lengths and in beam directions related to shapes of reflecting surfaces.

Other objects of the present invention will, in part, be obvious and will, in part, appear hereinafter when reading the following detailed description in conjunction with the drawings.

SUMMARY OF THE INVENTION

Interferometric apparatus and methods by which the local surface characteristics of photolithographic mirrors or the like may be interferometrically measured in-situ to provide correction signals for enhanced distance and angular measurement accuracy. Surface characterizations along one or multiple datum lines in one or more directions may be made by measuring the angular changes in beams reflected off the surfaces during scanning operations to determine local slope and then integrating the slope to arrive at surface topology. The mirrors may be mounted either on photolithographic stages or off the photolithographic stages on a reference frame. For the simplest case one dynamic beam-steering assembly or interferometer subsystem is employed for this purpose. For mirror characterization in two orthogonal directions, at least two dynamic beam-steering assemblies are used. One produces a signal that contains information about the change in slope of the mirror surface along the datum line and orthogonal to it and the other produces a signal that contains information about the angular orientation of the stage on which the mirror is mounted. These two signals are combined to extract information about the slope of the mirror along its datum line and orthogonal to it. The slope is then integrated to obtain topography as a function of displacement. Single beam interferometers are preferred because they can measure pitch, yaw, and displacement with only a single beam to the mirror. Measurements can be made of a plurality of mirrors facing in mutually orthogonal directions by sequentially holding one or more fixed relative to their elongated surfaces while translating the third along its elongated dimension and repeating the process. Alternatively, all mirrors can be moved together to obtain relative mirror topography. Three beam-steering assemblies may be used to fully characterize three corresponding mutually orthogonal mirrors and beam-steering or interferometer subsystems may be mounted on or off the translation stage.

Once the mirror's in-situ topography is established, it is stored in look-up-tables (LUTs), or the like, to provide real-time error correction signals to improve precision during normal operation.

The methodology may also be beneficially used with passive zero shear interferometers.

BRIEF DESCRIPTION OF THE DRAWINGS

The structure, operation, and methodology of the invention, together with other objects and advantages thereof, may best be understood by reading the detailed description in connection with the drawings in which each part has an assigned numeral that identifies it wherever it appears in the various drawings and wherein.

DETAILED DESCRIPTION

Figure 1:
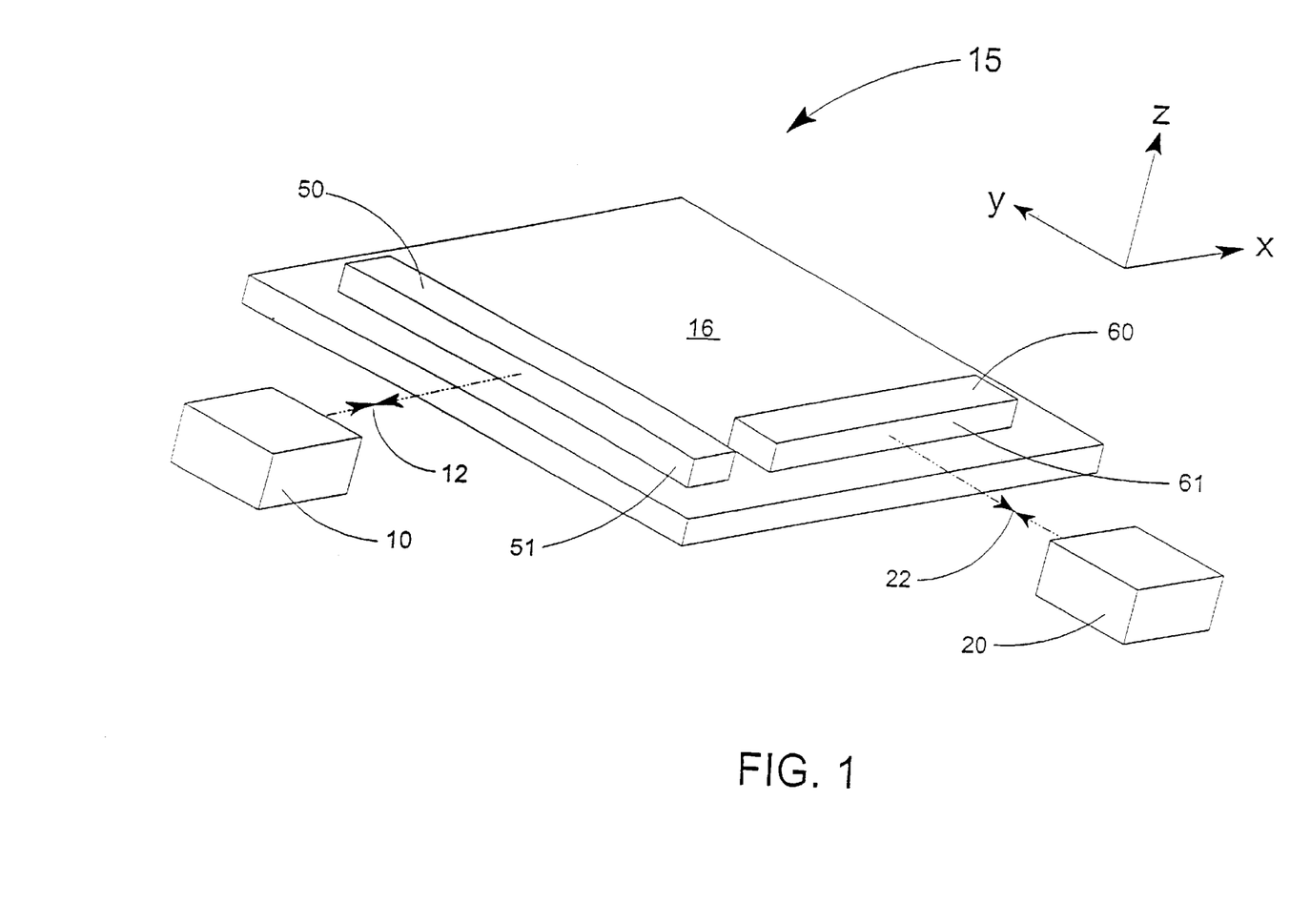
FIG. 1 is a diagrammatic perspective view of an interferometric apparatus employing a pair of orthogonally arranged dynamic interferometers by which the shape of an on-stage mounted elongated object mirror may be characterized in situ along a datum line as the stage is translated in one direction.

Reference is now made to FIG. 1 which is a diagrammatic perspective view of an interferometric system 15 that employs a pair of orthogonally arranged dynamic interferometers or interferometer subsystems by which the shape of an on-stage mounted elongated object mirror may be characterized in situ along a datum line. As shown in FIG. 1, system 15 comprises a stage 16 that preferably forms part of a photolithographic apparatus for fabricating semiconductor products such as integrated circuits or chips. Affixed to stage 16 is a thin, high aspect ratio planar mirror 50 having a y-z reflective surface 51 elongated in the y-direction. Also, fixedly mounted to stage 16 is another thin, high aspect ratio planar mirror 60 having an x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted in a well-known manner for nominally plane translation but may experience small angular rotations about the x, y, and z axes due to bearing and drive mechanism tolerances. In normal operation, system 15 is adapted to be operated for displacement in only the y-direction.

Fixedly mounted off-stage is a single beam dynamic interferometer (or interferometer subsystem) 10 for measuring angular rotation of stage 16, and thus planar mirror reflecting surface 51, about the y and z axes as stage 16 translates in the y-direction. To accomplish this, dynamic interferometer 10 is structured and arranged in the manner described in aforementioned PCT Patent Application filed May 5, 2000 and entitled "Interferometry Systems Having a Dynamic Beam-Steering Assembly For Measuring Angle and Distance" by Henry A. Hill which was Dublished as WO 00/66969 and in U.S. Pat. No. 6,271,923, the contents of which is incorporated herein by reference in its entirety. As described in that application, mirrors are provided with beam steering capability by which bothersome stage rotations are measured to provide feedback signals that are used to maintain beams on paths that are normal to the mirrors. Here, the return beam component of beam 12 is monitored, and its angle is measured via interferometric apparatus such as that described in U.S. patent application Ser. No. 60/201, 457 filed on May 3, 2000 in the name of Henry Allen Hill and entitled "Apparatus And Method(s) For Measuring And/Or Controlling Differential Paths Of Light Beams", and converted, at least in part, in U.S. patent application Ser. No. 09/842,556 filed on Apr. 26, 2001 in the name of Henry Allen Hill and bearing the title "DYNAMIC ANGLE MEASURING INTERFEROMETER" and published as US-2002-0033951 on Mar. 21, 2002, the entirety of which is incorporated herein by reference.

Input beam 12 preferably comprises two orthogonally polarized components having a difference in frequencies $f_1$. A source of input beam 12 such as a laser can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 μm He—Ne-longitudinal Zeeman Laser," *Applied Optics*, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," *Electronic Letters*, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics*, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (August 1968); Bagley et al., U.S. Pat. No. 3,656,853, issued Apr. 18, 1972; and H. Matsumoto, "Recent interferometric measurements using stabilized lasers," *Precision Engineering*, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," *Applied Optics*, 18(2), 219–224 (1979); N. Massie et al., "Measuring Laser Flow Fields With a 64-Channel Heterodyne Interferometer," *Applied Optics*, 22(14), 2141–2151 (1983); Y. Ohtsuka and M. Tsubokawa, "Dynamic Two-frequency Interferometry for Small Displacement Measurements," *Optics and Laser Technology*, 16, 25–29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," *Opt Eng.*, 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, et al., ibid.; (4) use of two longitudinal modes of a randomly polarized HeNe laser, see for example, J. B. Ferguson and R. H. Morris, "Single Mode Collapse in 6328 Å HeNe Lasers," *Applied Optics*, 17(18), 2924–2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," *Applied Optics*, 4(1), 142–143 (1965); or the use of the systems described in U.S. patent application with Ser. No. 09/061,928 filed Apr. 17, 1998 entitled "Apparatus to Transform Two Non-Parallel Propagating Optical Beam Components into Two Orthogonally Polarized Beam Components" by H. A. Hill, the contents of which are incorporated herein by reference.

The specific device used for the source of beam 12 will determine the diameter and divergence of beam 12. For some sources, e.g., a diode laser, it will likely be necessary to use conventional beam shaping optics, e.g., a conventional microscope objective, to provide beam 12 with a suitable diameter and divergence for elements that follow. When the source is a HeNe laser, for example, beam-shaping optics may not be required.

Another dynamic interferometer 20, preferably of the same design as that of interferometer 10, is fixedly mounted off-stage to measure the angular rotation of stage 16 about the x and z axes. To achieve this, interferometer 20 projects a beam 22 on to mirror surface 61. A return component of beam 22 is sent to an angle measuring interferometer as described above. Beam 22 is similarly generated as was beam 12.

Interferometer(s) 10 and 20 may also be passive zero shear interferometers of the type described in U.S. Provisional Patent Application No. 60/309,608 filed on Aug. 2, 2001 in the name of Henry A. Hill with the title "PASSIVE ZERO SHEAR INTERFEROMETER", now U.S. patent application Ser. No. 10/207,314 filed on Jul. 29, 2002 and published as US-2003-0053073 published on Mar. 20, 2003, the entire contents of which is incorporated herein by reference. Such passive zero shear interferometers operate to maintain beams 10 and 22 substantially orthogonal to the on-stage mounted mirrors.

While system 15 is normally operated to measure y translation, it is operated in a special mirror characterization mode to measure the shape of mirror surface 51 in situ along a datum line thereof. In the mirror characterization mode, stage 16 is translated in the y-direction so that the input beam 12 scans the mirror surface 51 along a datum line and generates a signal containing information indicative of its angular orientation and surface departure in the x-direction and z-direction, along with any contributions due to variations in the translation mechanism for moving stage 16. Simultaneous with translation of stage 16 in the y-direction, interferometer 20 monitors a single point on mirror 61 corresponding to the intercept point of beam 22 with reflecting surface 61. This step permits measurement of the rotation of stage 16 due to mechanical contributions of its translation mechanism, such as bearings, drive mechanisms, and the like. With this information, two signals are generated. The first from interferometer 10 which contains information about the change in slope of the mirror surface 51 along a datum line and orthogonal to the datum line, and the second from interferometer 20 which contains information about the angular orientation of stage 16. These two signals are combined to extract information only about the slope of mirror 51 along its datum line and orthogonal to its datum line, i.e., dx/dy and dx/dz. dx/dy is then integrated to obtain the x as a function of y. Thus, by measuring the direction of the change of the output beam 12 in the x-y and x-z planes and accounting for contributions to those changes brought about by changes in stage rotations, the shape of mirror surface 51 can be determined along a datum line and the slope dx/dz can be determined along the datum line while it is mounted in its working environment.

Single beam interferometers are preferred for this application because they can measure pitch, yaw, and distance (P, Y, and D ) with only a single beam going to the stage mirror 50. Without changing the normal operation, one can extract in-situ information about mirror shape with no additional hardware changes.

However, the second measurement in a second direction is required because with translation in the y-direction, stage bearings and the like cause the stage to wobble introducing large errors in orientation. Therefore, use is made of mirror surface 61 to measure the deviation or change in orientation of the stage by looking at the return beam part of 22, also done with a preferably dynamic interferometer.

An important feature of the use of single beam interferometers for this application is it contains all spatial frequencies up to the cutoff frequency given by 1/d, where d is the beam diameter whereas use of a double beam interferometer, such as the HSPMI, would cause loss of all spatial frequencies that have wavelengths equal to the beam spacing of the two double beams or harmonics thereof so the shape could not be recovered.

It will evident to those skilled in the art that the second interferometer 20 could be another form of angle measuring interferometer including multiple beam interferometers (not shown) but of the type shown and described in, for example, "Differential Interferometer Arrangements for Distance and Angle Measurements: Principles, Advantages, and Applications, C. Zanoni, VDI Berichte NR. 749, (1989), the contents of which are included herein by reference in its entirety, without departing from the scope or spirit of the present invention.

Figure 2:
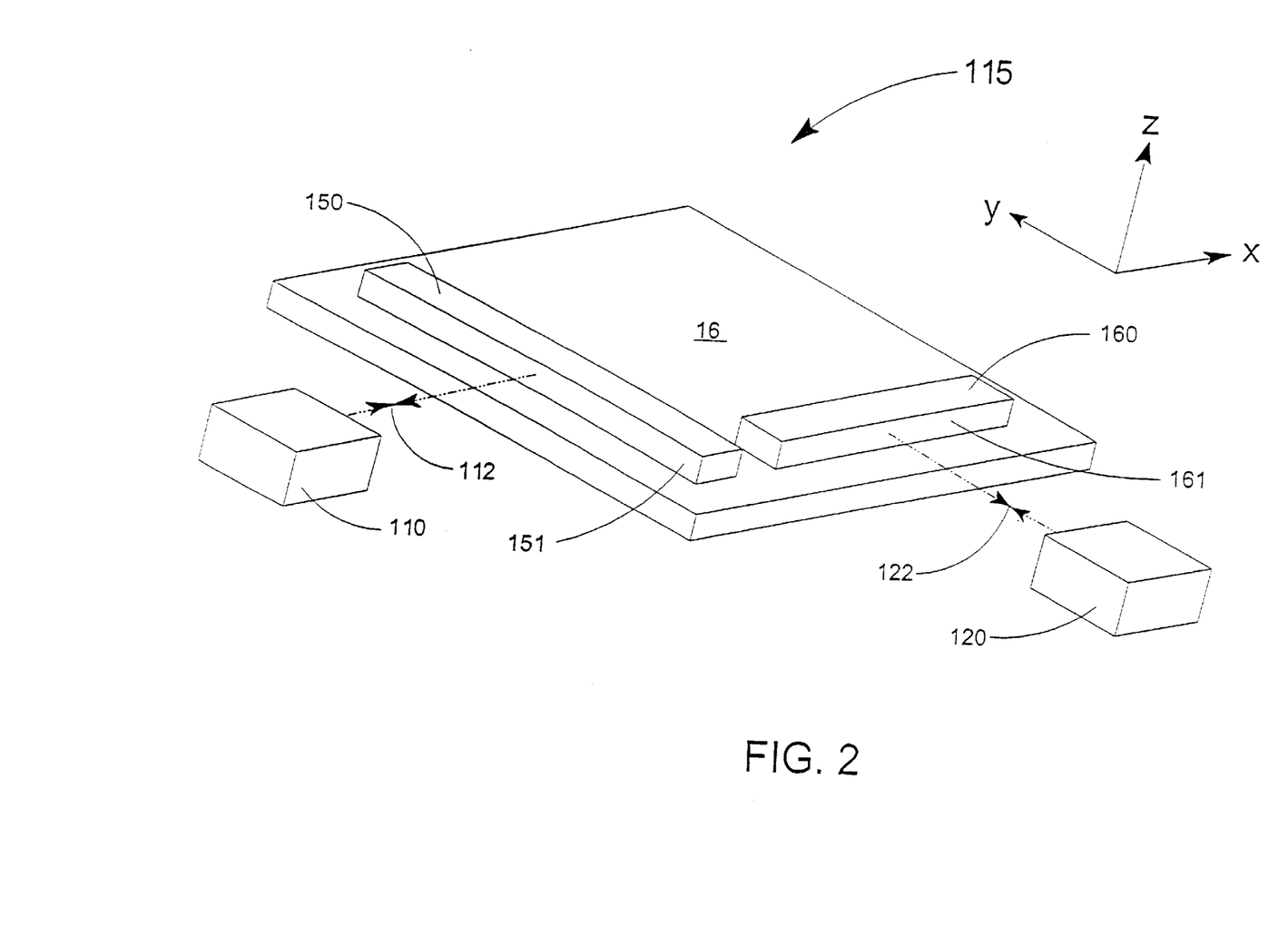
FIG. 2 is a diagrammatic perspective view of an interferometric apparatus employing a pair of orthogonally arranged dynamic interferometers by which the shapes of on-stage orthogonally mounted elongated object mirrors may be characterized in situ along datum lines associated with each mirror as the stage is translated preferably first in one direction and then in an orthogonal direction or by which the relative shapes of the mirrors may be obtained by simultaneous motion of the stage along orthogonal directions.

Reference is now made to FIG. 2 which is a diagrammatic perspective view of an interferometric apparatus depicted as system 115. System 115 employs a pair of orthogonally arranged dynamic interferometers by which the shapes of on-stage orthogonally mounted elongated object mirrors may be characterized in situ along datum lines associated with each mirror as a stage is translated first in one direction and then in an orthogonal direction or by which the relative shapes of the mirrors may be obtained by simultaneous motion of the stage along orthogonal directions.

As seen in FIG. 2, system 115 comprises a stage, again 16, mounted for plane translation but now normally operated to measure both x and y motion. A thin, high aspect ratio mirror 150 having a mirror surface 151 elongated in the y-direction is affixed to stage 16, and a thin, high aspect ratio mirror 160 having an elongated reflecting surface 161, elongated in the x-direction, is also fixedly mounted to stage 16 and nominally orthogonal to mirror 150.

System 115 may also be operated in one of two mirror characterization modes to measure the surfaces 151 and 161 in situ. In a first mirror characterization mode, system 115 is operated in the manner of the mirror characterization mode of system 15 in FIG. 1 to obtain the shape of surface 151. Then, stage 16 is moved in the x-direction, holding the y-translation fixed to obtain the shape of mirror 161 in a manner analogous to that for obtaining the shape of mirror 151. Thus, this is a two step operation.

In a second mirror characterization mode, stage 16 can be moved in x and y simultaneously. However, only the relationships between the shapes of mirror surfaces may be obtained. Only limited information would be obtained using this mode, but if this information is sufficiently for the intended downstream use, this mode eliminates one step in the previous process.

In connection with normal operation of both the embodiments of FIGS. 1 and 2 the goal is to obtain information about the shape of the mirrors so that this information can be used to correct for the influence of the mirror shapes on the precision with which distance can be measured. In this regard, a distance correction algorithm may be used which can be implemented with a look up table (LUT) or polynomial or Fourier series closed form approximation to adjust distance measurements. Corrections of the order of $\frac{1}{10}$ of a nanometer are possible.

Figure 3:
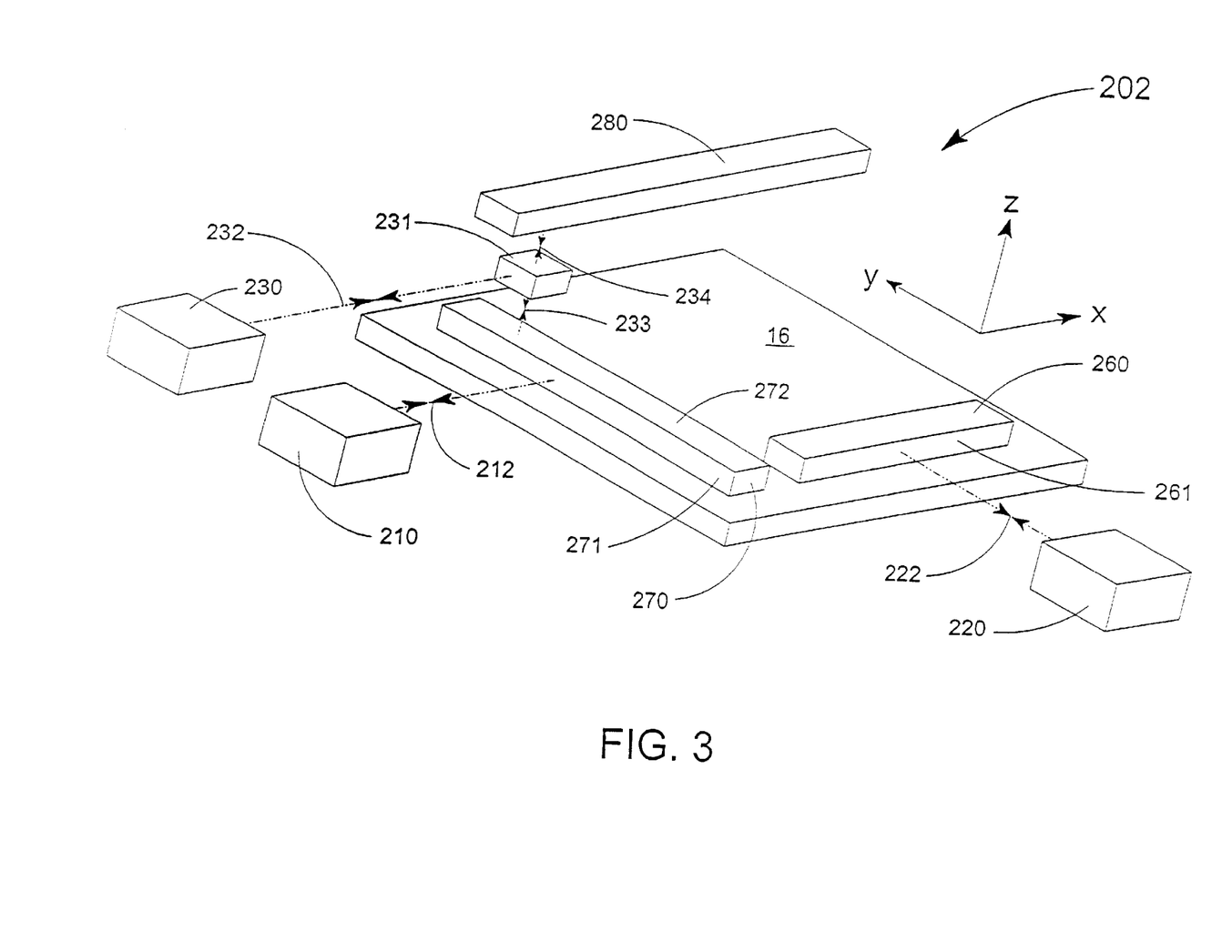
FIG. 3 is a diagrammatic perspective view of an interferometric apparatus employing three orthogonally arranged dynamic interferometers by which the shapes of on-stage orthogonally mounted elongated object mirrors may be characterized in situ along multiple orthogonal datum lines associated with each mirror as the stage is translated along three orthogonal directions.

FIG. 3 is a diagrammatic perspective view of an interferometric apparatus employing three orthogonally arranged dynamic interferometers by which the shapes of on-stage orthogonally mounted elongated object mirrors may be characterized in situ along multiple orthogonal datum lines (the x-z, x-y, and y-z planes) associated with each mirror as a stage is translated along three orthogonal directions, x, y, and z.

Referring now to FIG. 3, the apparatus of this embodiment is shown as a system 202 that comprises stage 16 atop of which is fixedly mounted a plane mirror 270 and a plane mirror 260. Plane mirror 260 has a reflecting surface 261 oriented in the x-z plane and elongated in the x-direction. Plane mirror 270 has a reflecting surface 271 oriented in the y-z plane and elongated in the y-direction. Mirror 270 also has a top reflecting surface 272 oriented in the x-y plane and elongated in the y-direction.

Fixedly mounted in a reference body (not shown) is an elongated plane mirror 280 having a lower reflective surface facing downwardly, towards stage 16. Fixedly mounted with respect to a portion of stage 16 making translations in only the x direction is a single beam interferometer 231 that is adapted to measure the vertical separation or altitude between mirror surface 272 and the underside of mirror 280.

Single beam interferometer 210 having output and return beam components in beam 212 measures x and pitch and yaw about the y and z axes as before. Single beam interferometer 220 having output and return beam components in beam 222 measures y and pitch and yaw about the x and z axes, respectively, also as before.

At any altitude the x and y profiles of mirrors 272 and 260 may be measured using the procedures previously described. In addition to this, however, this embodiment permits the x and y shapes of mirrors 260 and 270 to also be measured at different altitudes. For example, the x and y shapes may be determined at one altitude of stage 16 and then at another that may be vertically displaced, say 4 to 5 mm, above or below the first. To do this, angular changes in stage 16 introduced by motion in the z-direction must be taken into account for optimal precision.

Interferometer 231 is adapted in a manner to be described to be sensitive to changes in orientation of the stage 16 by virtue of it being a single beam interferometer, which makes a single pass of surfaces 280 and 272, and is otherwise configured to measure pitch and yaw for beam 233. Source/detector 230 feeds interferometer 231 (See FIGS. 4a and 4b). Therefore, if stage 16 rotates about the x or y axis, during a translation in the z direction interferometer 231 corrects for that. If beam 233 rolls about the x-axis for beam 212 and rolls about the y axis for beam 222 correction is also present. With that information for movement in the z direction, rotation of the stage 16 can be determined with motion in z compensated for such that surfaces 271 and 261 can be mapped in the in z-direction as well as y and x directions.

It will also be evident to those skilled in the art that the shape of surface 272 can also be obtained in the process of determining the shapes of surfaces 261 and 271.

Figure 4A:
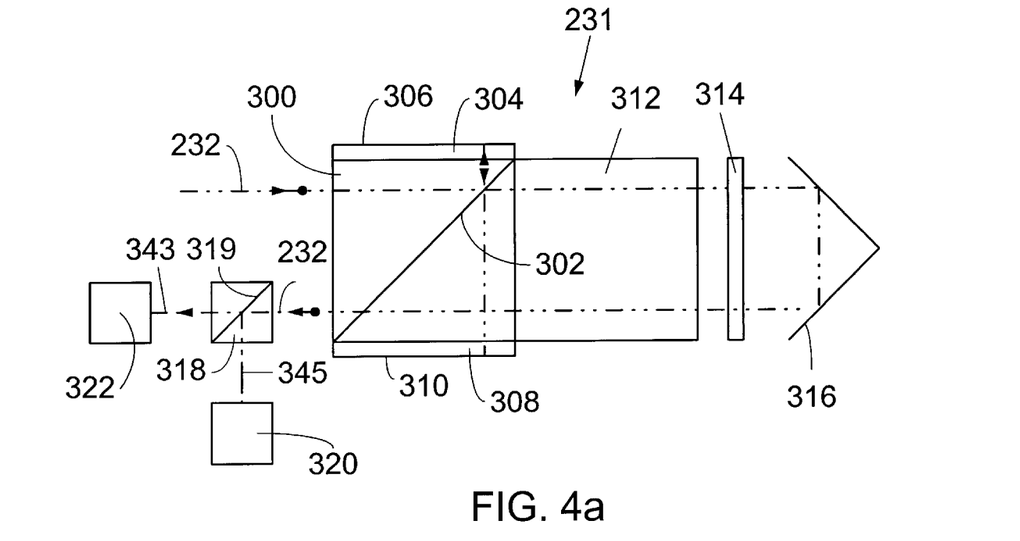
FIGS. 4a and 4b are, respectively, diagrammatic top and an elevational views of an interferometer for use in the apparatus of FIG. 3.
Figure 4B:
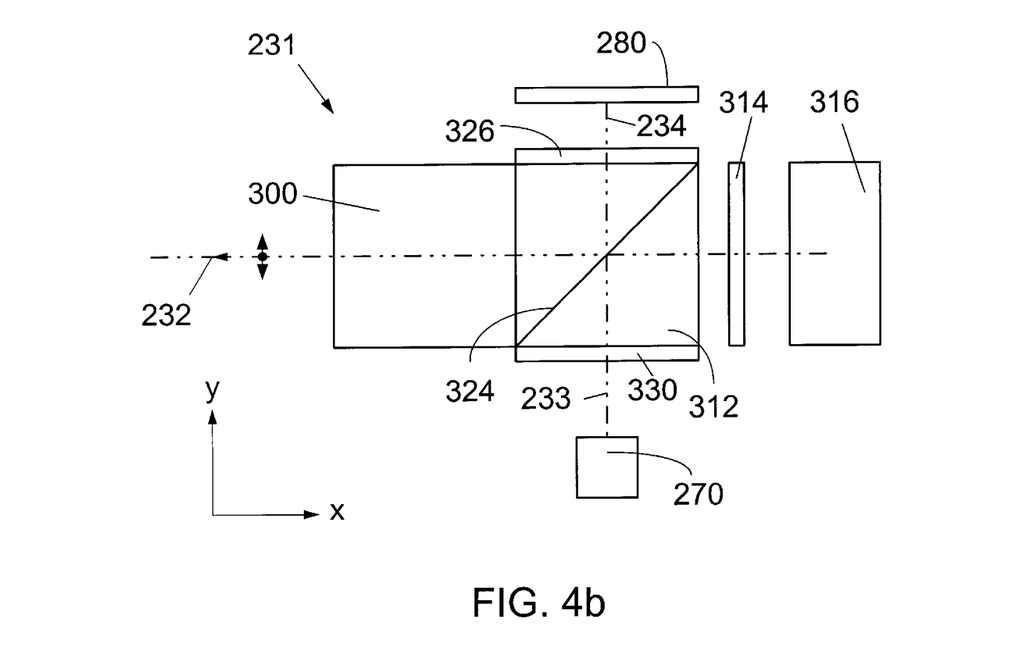

FIGS. 4a and 4b are, respectively, diagrammatic top and an elevational views of an interferometer 231 for use in the system 202 of FIG. 3. As seen there, interferometer 231 comprises a first polarizing beam splitter 300 (PBS) having a polarizing beam splitter layer 302 arranged perpendicular to the paper. PBS 300 is followed by a PBS 312 having PBS layer 324 oriented at right angles to PBS layer 302. PBS 312 is followed by a quarter-wave plate 314 and then a Porro prism 316.

PBS 300 has on one side a quarter-wave plate 304 atop of which sits a mirror reflecting surface 306, and on the opposite side of PBS 300 is provided with a quarter-wave plate 308 on which sits a reflective surface 310.

PBS 312 has a quarter-wave plate 326 on its top surface and another quarter-wave plate 330 on the bottom side. Mirrors 280 and 270 reside above and below quarter-wave plates 326 and 330, respectively.

A third PBS 318 is provided at the output end of PBS 300 and includes a PBS layer 319. The return component of beam 232 is split by PBS 318 into two beams 343 and 345 that are sent to photodetectors 322 and 320, respectively, to be converted to electrical signals for further analysis.

With this arrangement, if interferometer 231 rotates it doesn't change the orientation of the output beam. However, if either mirror 270 or 280 rotate, the corresponding angles will be measured.

The top view of interferometer in FIG. 4a depicts the path which the reference beam experiences as it travels through the interferometer 231 and the elevational view of FIG. 4b depicts the path which the measurement beam experiences as it travels through interferometer 231.

Figure 5:
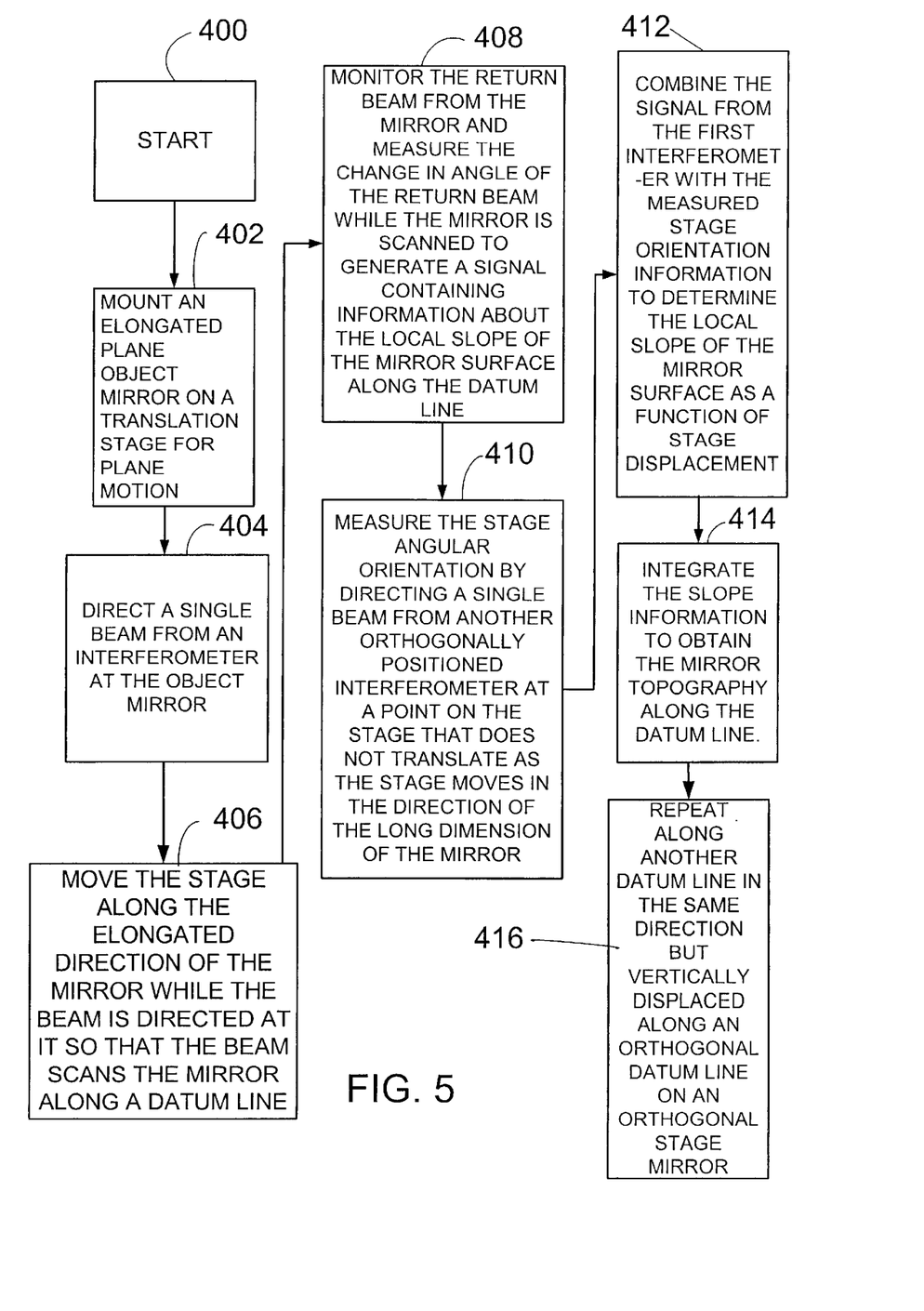
FIG. 5 is a flow chart in accordance with a method of the invention.

Having described apparatus by which a stage mirror may be characterized in situ, attention is now directed to FIG. 5 which shows a flowchart for a method for characterizing stage mirror topography in situ. As seen there, the method is first started in block 400, preferably with the stage 16 in a park position. The next step is to mount an elongated plane object mirror on a translation stage for plane motion as shown in block 402. This is followed by the step of directing a single beam from an interferometer at the object mirror. Next, the stage is moved along the elongated direction of the mirror while the beam is directed at it so that the beam scans the mirror along a datum line as shown in block 406. Following this, the return beam from the mirror is monitored and the change in angle of the return beam is measured while the mirror is scanned to generate a signal containing information about the local slope of the mirror surface along the datum line as shown in block 408. Then, the stage angular orientation is measured by directing a single beam from another orthogonally positioned interferometer at a point on the stage that does not translate as the stage moves in the direction of the long dimension of the mirror as shown in block 410. Following this, the signal from the first interferometer is combined with the measured stage orientation information to determine the local slope of the mirror surface as a function of stage displacement. Then in block 414, the slope information is integrated to obtain the mirror topography along the datum line. Finally, the process may be repeated as shown in block 416 to map either another orthogonally positioned stage mirror or to perform scanning along datum lines on the same mirror displaced from initial datum lines in the z-direction.

It will be appreciated that the foregoing process may be implemented via a suitably programmed general purpose computer or via dedicated microprocessors that additionally may be used to exercise overall control of system hardware elements, provide a user interface for system control and human intervention, and perform general housekeeping functions.

Having described the various embodiments, it will be obvious to those skilled in the relevant art how to make additional changes based on the teachings of the invention and all such changes are intended to be within the scope of the invention. For example, It is known in the metrology of lithography tool wafer stages to also place an interferometer on the wafer stage and place an associated bar mirror off the wafer stage on a reference frame of the lithography tool. See, for example, commonly owned U.S. Pat. No. 5,724,136 entitled "Interferometric Apparatus For Measuring Motions Of A Stage Relative to Fixed Reflectors" issued March 1998 by Carl A. Zanoni and U.S. Pat. No. 5,757,160 entitled "Moving Interferometer Wafer Stage" issued May 26, 1998 by Justin Kreuzer, the contents of both patent applications incorporated herein by reference.

The methods and apparatus described hereinabove may also be used to characterize in situ the figure of a bar mirror located off a wafer stage with a dynamic or zero shear interferometer used as the interferometer located on the wafer stage. Accordingly, for each of the foregoing embodiments relating to characterizing the figure(s) of bar mirror(s) with measuring surface(s) orientated orthogonal to the plane of a wafer on the wafer stage, there corresponds a set of embodiments with the bar mirror(s) located off the wafer stage fixed to a reference frame of a lithography tool and one or more dynamic or zero shear interferometers located on the wafer stage.

Figure 6:
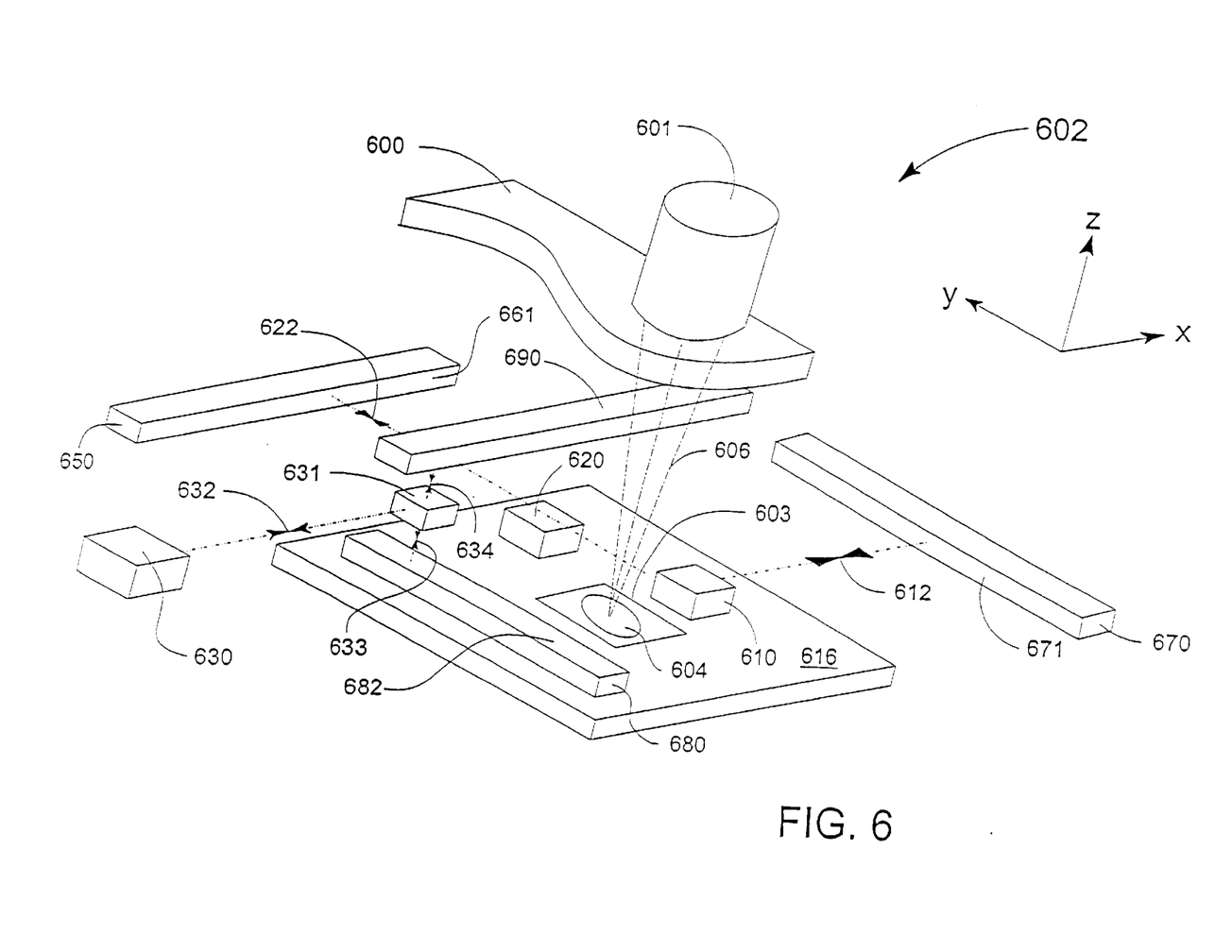
FIG. 6 is a diagrammatic perspective view of an interferometric apparatus employing three on-stage mounted orthogonally arranged dynamic interferometers by which the shapes of corresponding off-stage orthogonally mounted elongated object mirrors may be characterized in situ along multiple orthogonal datum lines associated with each mirror as the stage is translated along three orthogonal directions.

An example of such an embodiment may be seen in FIG. 6 to which reference is now made.

FIG. 6 is a diagrammatic perspective view of an interferometric apparatus 602 employing three on-stage, orthogonally arranged dynamic interferometers or interferometer subsystems by which the shapes of off-stage orthogonally mounted, thin, elongated object mirrors and an on-stage mounted, thin, elongated mirror may be characterized in situ along multiple datum lines (preferably in the x-z, x-y, and y-z planes) associated with each mirror as a translation stage 616 is translated along three orthogonal directions, x, y, and z. As will be appreciated, each interferometer subsystem in combination with an associated mirror or mirrors is an interferometer used principally for measuring the displacement of the translation stage 616 so that a wafer 604 held in position on stage 616 by a wafer holder 603 can be precisely positioned in an exposing beam 606 generated by a well-known exposure unit 601 that is mounted with a reference frame 600 (partially shown). The interferometer subsystems are preferably single beam, plane mirror interferometers, although this is not essential to the operation of the invention.

Referring now to FIG. 6, it can be seen that system 602 comprises translation stage 616 atop of which is fixedly mounted an interferometer subsystem 610 and an interferometer subsystem 620. Plane mirrors 650 and 670 are fixedly mounted to reference frame 600. Plane mirror 650 has a reflecting surface 661 oriented substantially in the x-z plane and elongated substantially in the x-direction. Plane mirror 670 has a reflecting surface 671 oriented substantially in the y-z plane and elongated substantially in the y-direction.

A mirror 680 is fixedly attached to the top of translation stage 616 and also has a top reflecting surface 682 oriented substantially in the x-y plane and elongated substantially in the y-direction.

Fixedly mounted in reference frame 600 (again partially shown) is an elongated plane mirror 690 having a lower reflective surface facing downwardly, towards stage 616. Fixedly mounted with respect to a portion of stage 616 making translations substantially in only the x direction is a single beam interferometer 631 that is adapted to measure the vertical separation or altitude between mirror surface 682 and the underside of mirror 690.

Single beam interferometer 610, having output and return beam components in beam 612, measures displacement substantially in the x direction and pitch and yaw substantially about the y and z axes, respectively, as before. Single beam interferometer 620, having output and return beam components in beam 622, measures displacement substantially in the y and pitch and yaw substantially about the x and z axes, respectively, also as before.

At any altitude the x and y profiles of mirrors 650 and 670 may be measured using the procedures previously described.

In addition to this, however, this embodiment permits the x and y shapes of mirrors 650 and 670 to also be measured at different altitudes and as a function of altitude. For example, the x and y shapes may be determined at one altitude of stage 616 and then at another that may be vertically displaced, say 4 to 5 mm, above or below the first. To do this, angular changes in stage 616 introduced by motion in the z-direction must be taken into account for optimal precision.

Interferometer subsystem 631 is adapted in a manner to be described to be sensitive to changes in orientation of the stage 616 by virtue of it being a single beam interferometer, which makes a single pass to the undersurface of 690 and to surface 682, and is otherwise configured to measure pitch and yaw for beam 633 relative to pitch and yaw for beam 634. Therefore, if stage 616 rotates about the x or y axis, during a translation in the z direction interferometer 631 corrects for that. With that information for movement in the z direction, rotation of the stage 616 can be determined with motion in z compensated for such that surfaces 671 and 661 can be mapped in the in z-direction as well as y and x directions. A source/detector 630 feeds interferometer subsystem 631 in the manner described in connection with the apparatus of FIGS. 4a and 4b which is analogous.

It will also be evident to those skilled in the art that the shape of surface 682 and the underside of mirror 690 can also be obtained in the process of determining the shapes of surfaces 661 and 671.

From the foregoing, it will be appreciated that thin, elongated mirrors for use in photolithographic applications and equipment may be characterized in situ through the use of interferometer subsystems associated with the mirrors with relative motion introduced by means of controlled motion of a translation stage operating in a mirror characterization mode. The relative motion may be the result of the mounting of the interferometer subsystems on the translation stage and certain of the thin, elongated mirrors mounted off the stage, fixedly mounted to a reference frame, or vice versa. Once the mirrors have been characterized, error correction signals may be used when the apparatus is operated in a measurement mode to precisely position a wafer with respect to the reference frame and in turn with respect to the mask used to expose the wafer.

The feed of a laser beam to the on-stage dynamic interferometers of FIG. 6 may be as described via source/detector 630 or by optical fibers as described by Zanoni, op. cit., or by free space transport as described for example by Kreuzer, op. cit., or some combination thereof. This applies equally in the case of zero shear interferometers.

Based on the teachings and embodiments described hereinabove, other variations of the invention will be apparent to those skilled in the relevant art and such variations are intended to be within the scope of the claimed invention.

What is claimed is:

1. Interferometric apparatus comprising;
   means for defining a reference frame;
   a translation stage;
   an electra-mechanical arrangement for selectively translating said translation stage in at least one of at least two orthogonal directions with respect to said reference frame;
   at least one thin, elongated mirror mounted in a predetermined manner with respect to said reference frame, said at least one thin, elongated mirror having a reflecting surface and a nominal datum line extending along its longitudinal dimension;
   at least one zero shear interferometer subsystem mounted in a predetermined manner with respect to said at least one thin, elongated mirror; adapted to cooperate with said at least one thin, elongated mirror to measure the displacement of said translation stage in at least one azimuth; and adapted to measure the local slope of said at one thin, elongated mirror along and orthogonal to its datum line and its local displacement normal to said reflecting surface;
   control means having a mode of operation for selectively translating said translation stage, said at least one thin, elongated mirror and said at least one interferometer subsystem moving relative to one another in said mode of operation so that said at least one interferometer subsystem scans said at least one thin, elongated mirror along its corresponding datum line to generate a signal containing information indicative of the surface topography thereof along with any contributions thereto due to variations present from said electra-mechanical arrangement per se; and
   signal and analysis means for extracting said information contained in said signal and developing correction signals to compensate for errors in optical path length and errors in beam direction related to the shape of said reflecting surface while said control means is in said mode of operation.

2. The interferometric apparatus of claim 1 wherein said at least one thin, elongated mirror is mounted to said translation stage for movement therewith and said at least one zero shear interferometer subsystem is fixedly mounted off said translation stage.

3. The interferometric apparatus of claim 1 wherein said at least one zero shear interferometer subsystem is fixedly mounted to said translation stage for movement therewith and said at least one thin, elongated mirror is fixedly mounted off said translation stage.

4. The interferometric apparatus of claim 1 wherein said control means is structured and arranged to have another mode of operation in which the motion of said translation stage is measured in at least one azimuth with respect to said reference frame.

5. The interferometric apparatus of claim 1 comprising at least two, thin elongated mirrors having reflecting surfaces orthogonally arranged with respect to one another and each including a nominal datum line extending along its longitudinal dimension and at least two zero shear interferometer subsystems at least in part mounted off said translation stage, each of said at least two zero shear interferometer subsystems being adapted to scan a corresponding one of said thin, elongated mirrors and configured to measure the local slope of the scanned mirror along and orthogonal to its datum line and its local displacement normal to said reflecting surface, said control means being further configured in said mode of operation to selectively translate said translation stage in one or all of its possible directions of motion so that at least one of said zero shear interferometer subsystems scans a corresponding one of said thin, elongated mirrors along its corresponding datum line to generate a signal containing information indicative of the surface topography of its corresponding reflecting surface along with any contributions thereto due to variations present from said electro-mechanical arrangement per se while the other of said zero shear interferometer subsystems generates a signal containing at least information about the angular change of said translation stage, said signal combining and analysis means extracting information contained in said signals to develop correction signals to compensate for errors in optical path length and errors in beam direction related to the shape of said at least two thin, elongated mirrors.

6. The apparatus of claim 1 wherein said at least one zero shear interferometer subsystem comprises a single beam, plane mirror interferometer subsystem.

7. The interferometric apparatus of claim 1 wherein said interferometric apparatus comprises three orthogonally arranged thin, elongated mirrors and three corresponding zero shear interferometer subsystems mounted for relative motion with respect to one another while said control means is in said mode of operation to measure the surface topography of said mirrors in three dimensions.

8. The interferometric apparatus of claim 1 further including a photolithographic wafer mount located on said translation stage for movement therewith.

9. The interferometric apparatus of claim 8 further including a photolithographic exposure unit fixedly mounted to said reference frame for forming masked patterns on wafers located on said translation stage.

10. Interferometric method comprising the steps of:
    defining a reference frame;
    providing a translation stage for movement with respect to said reference frame;
    selectively translating said translation stage in at least one of at least two orthogonal directions with respect to said reference frame;
    mounting at least one thin, elongated mirror in a predetermined manner with respect to said reference frame, said at least one thin, elongated mirror having a reflecting surface and a nominal datum line extending along its longitudinal dimension;
    mounting at least one zero shear interferometer subsystem in a predetermined manner with respect to said at least one thin, elongated mirror where said at least one zero shear interferometer subsystem is adapted to cooperate with said at least one thin, elongated mirror to measure the displacement of said translation stage in at least one azimuth and is also adapted to measure the local slope of said at one thin, elongated mirror along and orthogonal to its datum line and its local displacement normal to said reflecting surface;
    selectively translating said translation stage in a mode of operation in which said at least one thin, elongated mirror and said at least one zero shear interferometer subsystem move relative to one another in said mode of operation so that said at least one zero shear interferometer subsystem scans said at least one thin, elongated mirror along its corresponding datum line to generate a signal containing information indicative of the topography of said reflecting surface thereof along with any other contributions thereto due to variations present during said step of selectively translating said translation stage; and
    extracting said information contained in said signal and developing correction signals to compensate for errors in optical path length and errors in beam direction related to the shape of said surface while in said mode of operation.

11. The interferometric method of claim 10 wherein said at least one thin, elongated mirror is mounted to said translation stage for movement therewith and said at least one zero shear interferometer subsystem is fixedly mounted off said translation stage.

12. The interferometric method of claim 10 wherein said at least one zero shear interferometer subsystem is fixedly mounted to said translation stage for movement therewith and said at least one thin, elongated mirror is fixedly mounted off said translation stage.

13. The interferometric method of claim 10 having another mode of operation in which the motion of said translation stage is measured in at least one azimuth with respect to said reference frame.

14. The interferometric method of claim 10 in which there are provided at least two, thin elongated mirrors having reflecting surfaces orthogonally arranged with respect to one another with each including a nominal datum line extending along its longitudinal dimension and at least two zero shear interferometer subsystems at least in part mounted off said translation stage, each of said at least two zero shear interferometer subsystems being adapted to scan a corresponding one of said thin, elongated mirrors and configured to measure the local slope of the scanned mirror along and orthogonal to its datum line and its local displacement normal to said reflecting surface, said method being further configured in said mode of operation to selectively translate said translation stage in one or all of its possible directions of motion so that at least one of said zero shear interferometer subsystems scans a corresponding one of said thin, elongated mirrors along its corresponding datum line to generate a signal containing information indicative of the angular change and surface departure of its corresponding reflecting surface along with any contributions thereto due to variations present from any other contributions present during said step of selectively translating said translation stage while the other of said zero shear interferometer subsystems generates a signal containing at least information about the angular change of said translation stage, said step of extracting information contained in said signals developing correction signals to compensate for errors in optical path length and errors in beam direction related to the shape of said at least two thin, elongated mirrors.

15. The interferometric method of claim 10 wherein said at least one zero shear interferometer subsystem comprises a single beam, plane mirror interferometer subsystem.

16. The interferometric method of claim 10 in which there are provided three orthogonally arranged thin, elongated mirrors and three corresponding zero shear interferometer subsystems mounted for relative motion with respect to one another while in said mode of operation to measure the topography of said mirrors in three dimensions.

17. The interferometric method of claim 10 further including the step of mounting a photolithographic wafer on said translation stage for movement therewith.

18. The interferometric method of claim 17 further including photolithographically exposing said wafer from said reference frame with masked patterns of illumination.

19. Interferometric apparatus comprising:
    at least one zero shear interferometer including a mirror moveably mounted for displacement along a path of travel, said interferometer being adapted to direct a measurement beam with a predetermined diameter at said mirror to generate a measurement signal containing information indicative of the relative displacement of said mirror and to generate an information signal indicative of the topography of said mirror and direction of travel of said measurement beam as reflected from said mirror at points where said measurement beam impinges on said mirror; and
    signal and analysis means for operating on said information signal to develop correction signals to compensate said measurement signal for errors in optical path length and errors in beam direction of said measurement beam related to the shape of said moveably mounted mirror and its angular orientation while moving.

* * * * *